(12) United States Patent
Chern

(10) Patent No.: US 11,074,985 B1
(45) Date of Patent: Jul. 27, 2021

(54) ONE-TIME PROGRAMMABLE MEMORY DEVICE AND METHOD FOR OPERATING THE SAME

(71) Applicant: HeFeChip Corporation Limited, Sai Ying Pun (HK)

(72) Inventor: Geeng-Chuan Chern, Cupertino, CA (US)

(73) Assignee: HeFeChip Corporation Limited, Sai Ying Pun (HK)

( * ) Notice: Subject to any disclaimer, the term of this patent is extended or adjusted under 35 U.S.C. 154(b) by 0 days.

(21) Appl. No.: 16/801,121

(22) Filed: Feb. 25, 2020

(51) Int. Cl.
*G11C 17/16* (2006.01)
*G11C 17/18* (2006.01)
*H01L 27/112* (2006.01)

(52) U.S. Cl.
CPC ........ *G11C 17/18* (2013.01); *H01L 27/11206* (2013.01)

(58) Field of Classification Search
CPC ...................................................... G11C 17/16
USPC .......................................................... 365/96
See application file for complete search history.

(56) References Cited

U.S. PATENT DOCUMENTS

| | | |
|---|---|---|
| 3,423,646 A | 1/1969 | Cubert |
| 3,634,929 A | 1/1972 | Yoshida |
| 4,322,822 A | 3/1982 | McPherson |
| 4,507,757 A | 3/1985 | McElroy |
| 4,823,181 A | 4/1989 | Mohsen |
| 5,019,878 A | 5/1991 | Yang |
| 5,672,994 A | 9/1997 | Au |
| 6,258,641 B1 * | 7/2001 | Wong ................... H01L 27/0921 257/351 |
| 6,580,145 B2 | 6/2003 | Wu |
| 6,597,234 B2 | 7/2003 | Reber |
| 7,002,219 B1 * | 2/2006 | de Jong ............... H01L 23/5256 257/357 |
| 7,102,910 B2 | 9/2006 | Pham |
| 7,402,855 B2 | 7/2008 | Kurjanowicz |
| 8,213,211 B2 | 7/2012 | Kurjanowicz |
| 8,471,355 B2 | 6/2013 | Kurjanowicz |
| 9,281,074 B2 | 3/2016 | Wu |
| 10,163,783 B1 | 12/2018 | Chang |
| 10,181,357 B2 | 1/2019 | Wong |
| 2010/0214008 A1 * | 8/2010 | Li ......................... H01L 27/112 327/525 |
| 2013/0039117 A1 | 2/2013 | Lin |

(Continued)

FOREIGN PATENT DOCUMENTS

EP 3 270 539 A1 1/2018

OTHER PUBLICATIONS

Chern, the specification, including the claims, and drawings in the U.S. Appl. No. 16/876,092, filed May 17, 2020.

(Continued)

*Primary Examiner* — Min Huang
(74) *Attorney, Agent, or Firm* — Winston Hsu

(57) ABSTRACT

A semiconductor device including at least an OTP unit cell is disclosed. The OTP unit cell includes a read select transistor, a data storage transistor serially connected to the read select transistor, and a program select transistor. The drain of the program select transistor is electrically coupled to the gate of the data storage transistor. The programming path for programming the three-transistor unit cell is different from the reading path for reading the OTP unit cell.

24 Claims, 6 Drawing Sheets

(56) References Cited

U.S. PATENT DOCUMENTS

2016/0104542 A1    4/2016  Wu
2017/0301406 A1*  10/2017  Wong ..................... G11C 16/14
2019/0027228 A1*  1/2019  Hsu ..................... H01L 27/1211

OTHER PUBLICATIONS

Chern, the specification, including the claims, and drawings in the U.S. Appl. No. 16/856,055, filed Apr. 23, 2020.
Chern, the specification, including the claims, and drawings in the U.S. Appl. No. 16/846,424, filed Apr. 13, 2020.
Liu et al., "A Gate-Oxide-Breakdown Antifuse OTP ROM Array Based on TSMC 90nm Process", 2015 IEEE, 2015.

* cited by examiner

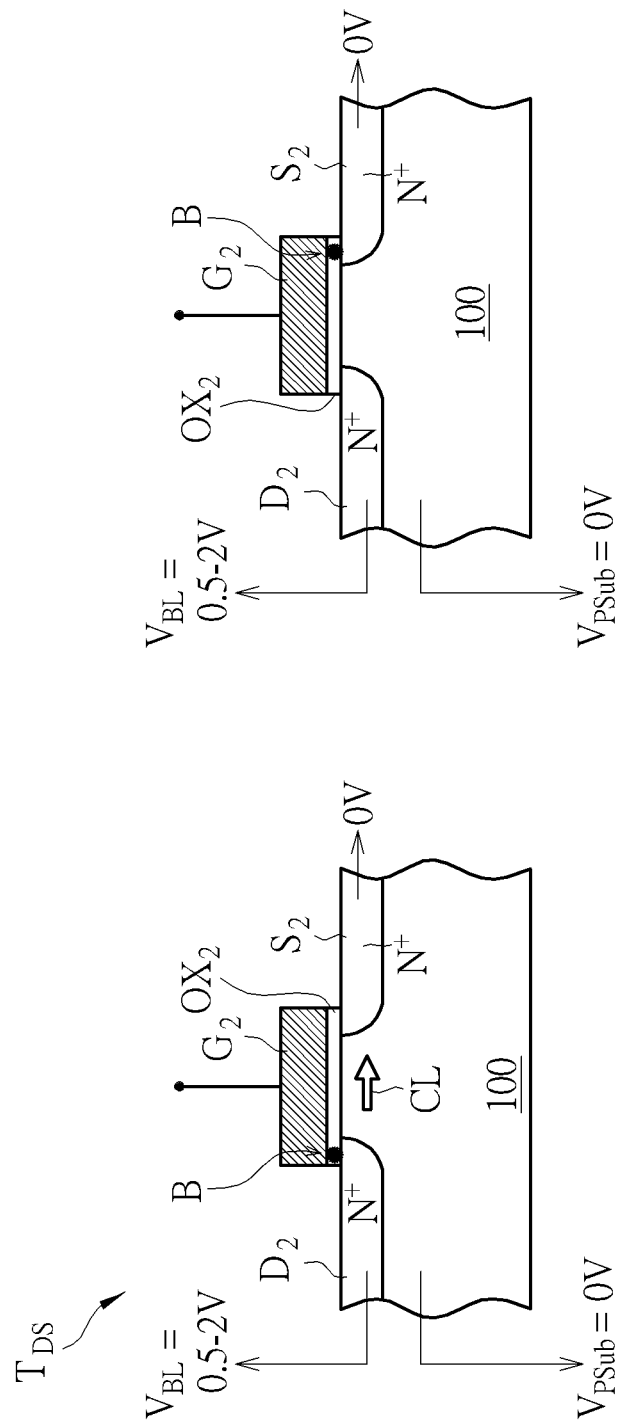

ONE-TIME PROGRAMMABLE MEMORY DEVICE AND METHOD FOR OPERATING THE SAME

BACKGROUND OF THE INVENTION

1. Field of the Invention

The present disclosure relates generally to the field of non-volatile memory. More particularly, the present disclosure relates to a one-time programmable (OTP) memory device that is programmed by dielectric breakdown and is read by sensing the channel current of the data storage transistor.

2. Description of the Prior Art

As known in the art, non-volatile memory retains stored information even after power is removed from the non-volatile memory circuit. Some non-volatile memory designs permit reprogramming, while other designs only permit one-time programming. Thus, one form of non-volatile memory is a One-Time Programmable (OTP) memory.

An OTP memory may contain an antifuse. An antifuse functions oppositely to a fuse by initially being nonconductive. When programmed, the antifuse becomes conductive. To program an antifuse, a dielectric layer such as an oxide is subjected to a high electric field to cause dielectric breakdown or oxide rupture. After dielectric breakdown, a conductive path is formed through the dielectric and thereby makes the antifuse become conductive.

To read the memory cell, a current passing through the ruptured or unruptured oxide is typically required. However, some ruptured oxides could be in a soft breakdown condition. The leakage current of the oxide in soft breakdown condition could be small. Therefore, a complicate sensing amplifier is often needed to compare the source side and drain side gate oxide leakage currents.

SUMMARY OF THE INVENTION

It is one objective of the present disclosure to provide a structure, as well as method of operating same, of a semiconductor memory device based on dielectric breakdown without the need of complicate sensing circuit for comparing the ruptured and unruptured dielectric leakage currents during read operation.

One aspect of the present disclosure provides a semiconductor memory cell comprising at least a one-time programmable (OTP) unit cell wherein a programming path for programming the OTP unit cell is different from the reading path for reading the OTP unit cell.

The OTP unit cell includes a read select transistor on the semiconductor substrate, a data storage transistor in series connection with the read select transistor, and a program select transistor. The read select transistor comprises a first gate, a first gate dielectric layer between the first gate and the semiconductor substrate, a first drain region in the semiconductor substrate on one side of the first gate, and a first source region in the semiconductor substrate on the other side of the first gate. The data storage transistor comprises a second gate, a second gate dielectric layer between the second gate and the semiconductor substrate, a second drain region in the semiconductor substrate on one side of the second gate, and a second source region in the semiconductor substrate on the other side of the second gate. The program select transistor comprises a third gate, a third gate dielectric layer between the third gate and the semiconductor substrate, a third drain region in the semiconductor substrate on one side of the third gate, and a third source region in the semiconductor substrate on the other side of the third gate. The third drain region of the program select transistor is electrically coupled to the second gate of the data storage transistor.

According to some embodiments, the semiconductor substrate comprises a first active area isolated by a first trench isolation structure and a second active area isolated by a second trench isolation structure.

According to some embodiments, the read select transistor and the data storage transistor are constructed on the first active area, and the program select transistor is constructed on the second active area.

According to some embodiments, the semiconductor substrate has a first conductivity type, and wherein the first drain region, the first source region, the second drain region, the second source region, the third drain region, and the third source region have a second conductivity type that is opposite to the first conductivity type.

According to some embodiments, the first conductivity type is P type and the second conductivity type is N type.

According to some embodiments, the semiconductor substrate comprises a silicon substrate or a silicon-on-insulator (SOI) substrate.

According to some embodiments, the read select transistor, the data storage transistor, and the program select transistor are NMOS transistors.

According to some embodiments, the first gate, the second gate, and the third gate comprise a single polysilicon layer or a metal gate.

According to some embodiments, a source junction breakdown voltage and a drain junction breakdown voltage of the data storage transistor are higher than a gate dielectric breakdown voltage of the data storage transistor.

According to some embodiments, a gate dielectric breakdown voltage and a junction breakdown voltage of the read select transistor are both higher than the gate dielectric breakdown voltage of the data storage transistor.

According to some embodiments, the second gate dielectric layer has a thickness that is smaller than that of the first gate dielectric layer.

According to some embodiments, the semiconductor substrate is a P type substrate, and wherein the read select transistor, the data storage transistor, and the program select transistor are constructed on a triple well structure comprising a deep N well in the P type substrate and a P well isolated from the P type substrate by the deep N well.

According to some embodiments, a process for programming digital "1" to the OTP unit cell includes the following steps:

grounding the semiconductor substrate and the third source region of the program select transistor;

electrically floating or grounding the second source region of the data storage transistor;

turning on the program select transistor by applying a program select voltage to the third gate, thereby coupling the second gate to ground;

applying a read select voltage to the first gate of the read select transistor, wherein the read select voltage is higher than a breakdown voltage of the second gate dielectric layer; and ramping up a bit line voltage applied to the first drain region of the read transistor through a current limiter to break down a portion of the second gate dielectric layer that is directly above the second drain region of the data storage transistor.

According to some embodiments, the program select voltage ranges between 1-3V and the read select voltage ranges between 3-10V.

According to some embodiments, a process for programming digital "1" to the OTP unit cell includes the following steps:

grounding the semiconductor substrate and the third source region of the program select transistor;

electrically floating or grounding the second source region of the data storage transistor;

turning on the program select transistor by applying a program select voltage to the third gate, thereby coupling the second gate to ground;

applying a read select voltage to the first gate of the read select transistor, wherein the read select voltage is higher than a breakdown voltage of the second gate dielectric layer; and applying a pre-set bit line voltage higher than the breakdown voltage of the second gate dielectric layer, to the first drain region through a current limiter.

According to some embodiments, a process for programming digital "0" to the OTP unit cell includes the following steps:

grounding the semiconductor substrate;

turning on the program select transistor by applying a program select voltage to the third gate, thereby coupling the second gate to ground;

applying 0V to the first gate of the read select transistor to turn off the read select transistor; and ramping up a source line voltage applied to the second source region of the data storage transistor through a current limiter to break down a portion of the second gate dielectric layer that is directly above the second source region of the data storage transistor.

According to some embodiments, the program select voltage ranges between 1-3V and the source line voltage ranges between 3-10V.

According to some embodiments, a process for programming digital "0" to the OTP unit cell includes the following steps:

grounding the semiconductor substrate;

turning on the program select transistor by applying a program select voltage to the third gate, thereby coupling the second gate to ground;

applying 0V to the first gate of the read select transistor to turn off the read select transistor; and applying a pre-set source line voltage higher than gate dielectric breakdown voltage of the data storage transistor, to the second source region through a current limiter.

According to some embodiments, a process for reading the OTP unit cell includes the following steps:

turning off the program select transistors so that the second gate of the data storage transistor is isolated from outside bias;

applying a read select voltage to the first gate of the read select transistor to turn on the read select transistor;

applying a bit line voltage to the first drain region of the read select transistor; and grounding all other terminals of the OTP unit cell.

According to some embodiments, the read select voltage ranges between 1-3V and the bit line voltage ranges between 0.5-2V.

According to some embodiments, the OTP unit cell comprises a programmable MOS transistor that is electrically programmed to "1" state or "0" state.

According to some embodiments, the programmable MOS transistor is programmed to the "1" state by rupturing a gate dielectric layer between a gate and a drain of the MOS transistor.

According to some embodiments, the programmable MOS transistor is programmed to "0" state by rupturing the gate dielectric layer between the gate and a source of the MOS transistor.

According to some embodiments, the gate of the programmable MOS transistor is switched between ground and floating by a switching MOS transistor.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings:

FIG. 8 is a cross section of the data storage transistor with "1" state during read operation; and FIG. 9 is a cross section of the data storage transistor with "0" state during read operation.

DETAILED DESCRIPTION

Figure 1:
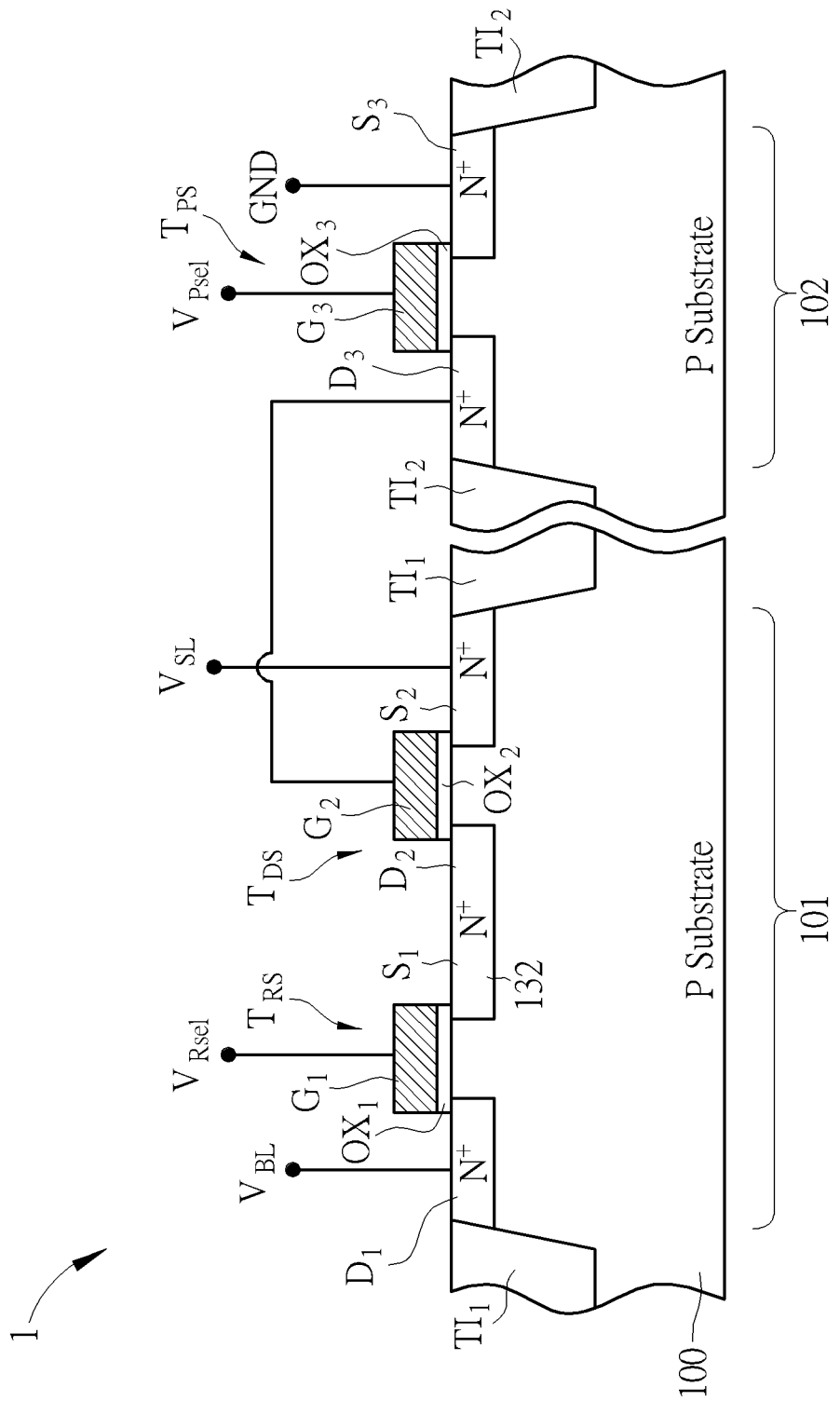
FIG. 1 is a cross section of a semiconductor memory cell in accordance with one embodiment of the invention.

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

It will be appreciated that although some conductivity types have been used for illustrative purposes, the invention may be practiced with opposite conductivity types. For example, an NMOS transistor in one embodiment may be replaced with a PMOS transistor in another embodiment without departing from the spirit and scope of the invention.

The present invention pertains to a semiconductor memory device based on dielectric breakdown, which comprises a One-Time Programmable (OTP) memory array that is composed of a plurality of three-transistor (3T) bit cell structures. The OTP memory array utilizes the channel current, instead of ruptured or unruptured dielectric leakage current, for read operations. This invention has a great advantage over the prior art because the state "1" bit current is the transistor "on" current that is consistently high without too much variation other than those caused by manufacture process fluctuation, while the state "0" bit current is the very small transistor "off" current.

One aspect of the invention provides a semiconductor device including at least a one-time programmable (OTP) unit cell. A programming path for programming the OTP unit cell is different from a reading path for reading the OTP unit cell. According to some embodiments, the OTP unit cell comprises a programmable MOS transistor that is electrically programmed to "1" state or "0" state. According to some embodiments, the programmable MOS transistor is programmed to the "1" state by rupturing a gate dielectric layer between a gate and a drain of the MOS transistor. According to some embodiments, the programmable MOS transistor is programmed to "0" state by rupturing the gate dielectric layer between the gate and a source of the MOS transistor. According to some embodiments, the gate of the programmable MOS transistor is switched between ground and floating by a switching MOS transistor.

FIG. 1 is a cross section of a semiconductor memory cell (or OTP unit cell) in accordance with one embodiment of the invention. According to one embodiment of the invention, the illustrated semiconductor memory cell may be a 3T bit cell structure that is included in an OTP memory array. As shown in FIG. 1, the semiconductor memory cell (or OTP unit cell) 1 comprises a read select transistor $T_{RS}$ that is in series connection with a data storage transistor (or an antifuse transistor) $T_{DS}$ for storing a digit "1" or a digital "0" data. The read select transistor $T_{RS}$ and the data storage transistor $T_{DS}$ may be constructed on the first active area 101 that is isolated by a first trench isolation structure $TI_1$. The first active area 101 may be defined on a semiconductor substrate 100 having a first conductivity type, for example, P type. According to one embodiment, for example, the semiconductor substrate 100 may be a silicon substrate or a silicon-on-insulator (SOI) substrate, but not limited thereto.

The read select transistor $T_{RS}$ may be used to "select" a memory cell for reading. According to one embodiment of the invention, the read select transistor $T_{RS}$ comprises a first gate $G_1$, a first gate dielectric layer $OX_1$ between the first gate $G_1$ and the semiconductor substrate 100, a first drain region $D_1$ in the semiconductor substrate 100 on one side of the first gate $G_1$, and a first source region $S_1$ in the semiconductor substrate 100 on the other side of the first gate $G_1$. According to one embodiment of the invention, the read select transistor $T_{RS}$ may be an NMOS transistor, and the first drain region $D_1$ and the first source region $S_1$ may be $N^+$ doping regions. The first gate $G_1$ may be a single polysilicon (or single poly) layer or a metal gate.

According to one embodiment of the invention, the data storage transistor $T_{DS}$ comprises a second gate $G_2$, a second gate dielectric layer $OX_2$ between the second gate $G_2$ and the semiconductor substrate 100, a second drain region $D_2$ in the semiconductor substrate 100 on one side of the second gate $G_2$, and a second source region $S_2$ in the semiconductor substrate 100 on the other side of the second gate $G_2$. According to one embodiment of the invention, the data storage transistor $T_{DS}$ may be an NMOS transistor, and the second drain region $D_2$ and the second source region $S_2$ may be $N^+$ doping regions. Likewise, the second gate $G_2$ may be a single polysilicon layer or a metal gate. Therefore, the read select transistor $T_{RS}$ and the data storage transistor $T_{DS}$ constitute two serially connected NMOS transistors on the first active area 101. The $N^+$ doping region 132 between the first gate $G_1$ and the second gate $G_2$ in the semiconductor substrate 100 is commonly shared by the read select transistor $T_{RS}$ and the data storage transistor $T_{DS}$.

According to one embodiment of the invention, the second gate dielectric layer $OX_2$ may have a thickness that is smaller than that of the first gate dielectric layer $OX_1$ to avoid potential damage to the read select transistor $T_{RS}$ during program operation.

As shown in FIG. 1, the semiconductor memory cell 1 further comprises a program select transistor $T_{PS}$ that is used to "select" a memory cell for programming. The program select transistor $T_{PS}$ is constructed on the second active area 102 that is isolated by a second trench isolation structure $TI_2$.

The second active area 102 may be disposed in close proximately to the first active area 101. According to one embodiment of the invention, the program select transistor $T_{PS}$ comprises a third gate $G_3$, a third gate dielectric layer $OX_3$ between the third gate $G_3$ and the semiconductor substrate 100, a third drain region $D_3$ in the semiconductor substrate 100 on one side of the third gate $G_3$, and a third source region $S_3$ in the semiconductor substrate 100 on the other side of the third gate $G_3$. The third drain region $D_3$ is electrically coupled to the second gate $G_2$.

According to one embodiment of the invention, the program select transistor $T_{PS}$ may be an NMOS transistor, and the third drain region $D_3$ and the third source region $S_3$ may be $N^+$ doping regions. Likewise, the third gate $G_3$ may be a single polysilicon layer or a metal gate.

Figure 2:
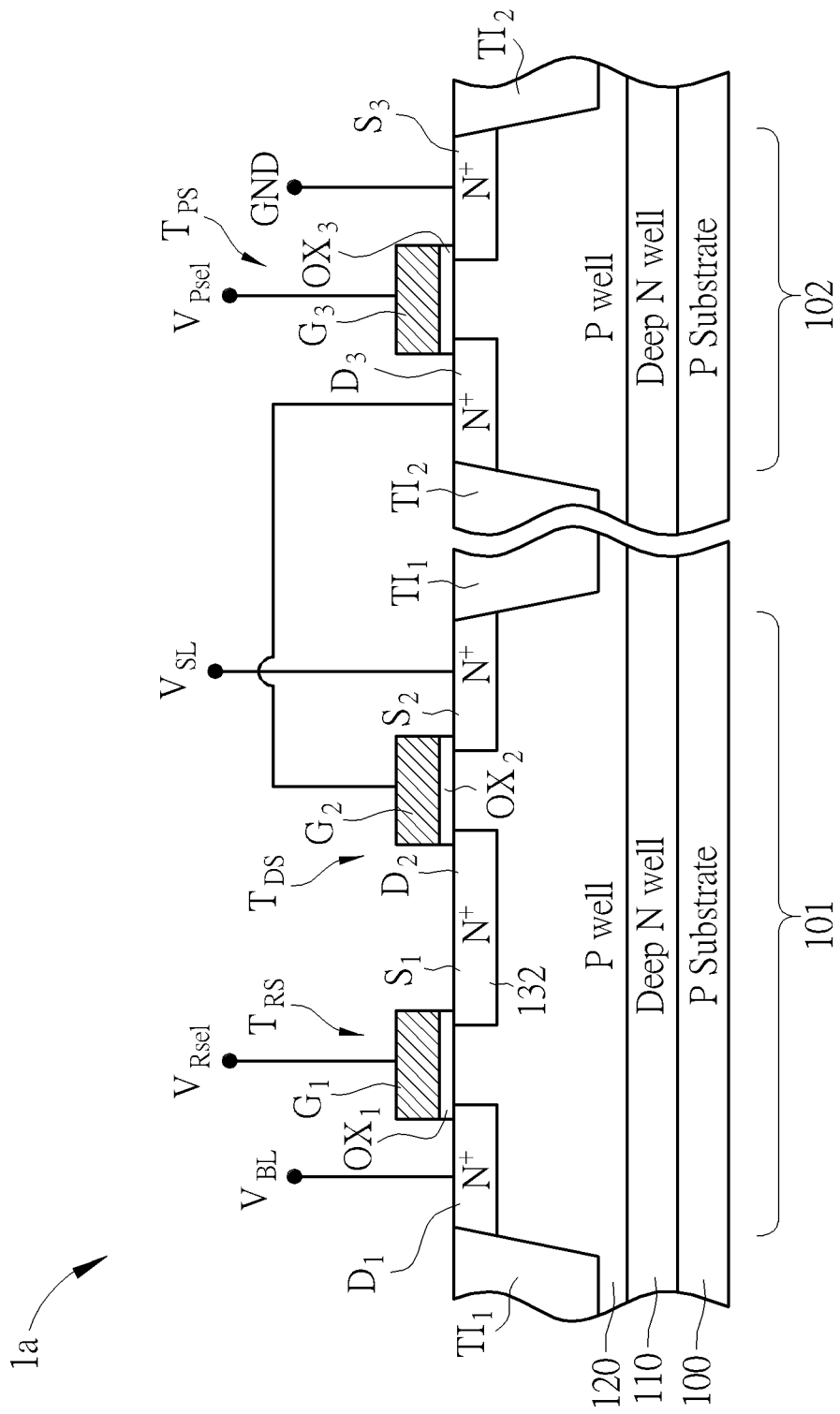
FIG. 2 is a cross section of a semiconductor memory cell in accordance with another embodiment of the invention, wherein a triple well is employed.

In another embodiment, as shown in FIG. 2, the semiconductor memory cell 1a comprising the read select transistor $T_{RS}$, the data storage transistor $T_{DS}$, and the program select transistor $T_{PS}$ may be constructed on a triple well structure comprising a deep N well 110 in the P type semiconductor substrate (P Substrate) 100 and a P well 120 isolated from the P type semiconductor substrate 100 by the deep N well 110. During program or read operations, the P well may be biased to a predetermined P well voltage through a P well pickup region (not shown in this figure). It is understood that the illustrated transistors may further comprise other elements such as spacers on sidewalls of the gates or lightly doped drain (LDD) regions merged with the heavily doped source/drain regions, which are not explicitly shown in the figures for the sake of simplicity.

According to one embodiment of the invention, during operation, the first drain region $D_1$ is electrically coupled to a bit line voltage $V_{BL}$, the first source region $S_1$ and the second drain region $D_2$ (i.e., the $N^+$ doping region 132) are electrically floating, the second source region $S_2$ is electrically coupled to a source line voltage $V_{SL}$, the third source region $S_3$ is electrically coupled to ground (GND), the first gate $G_1$ is electrically coupled to a read select voltage $V_{RSel}$, and the third gate $G_3$ is electrically coupled to a program select voltage $V_{PSel}$.

Figure 3:
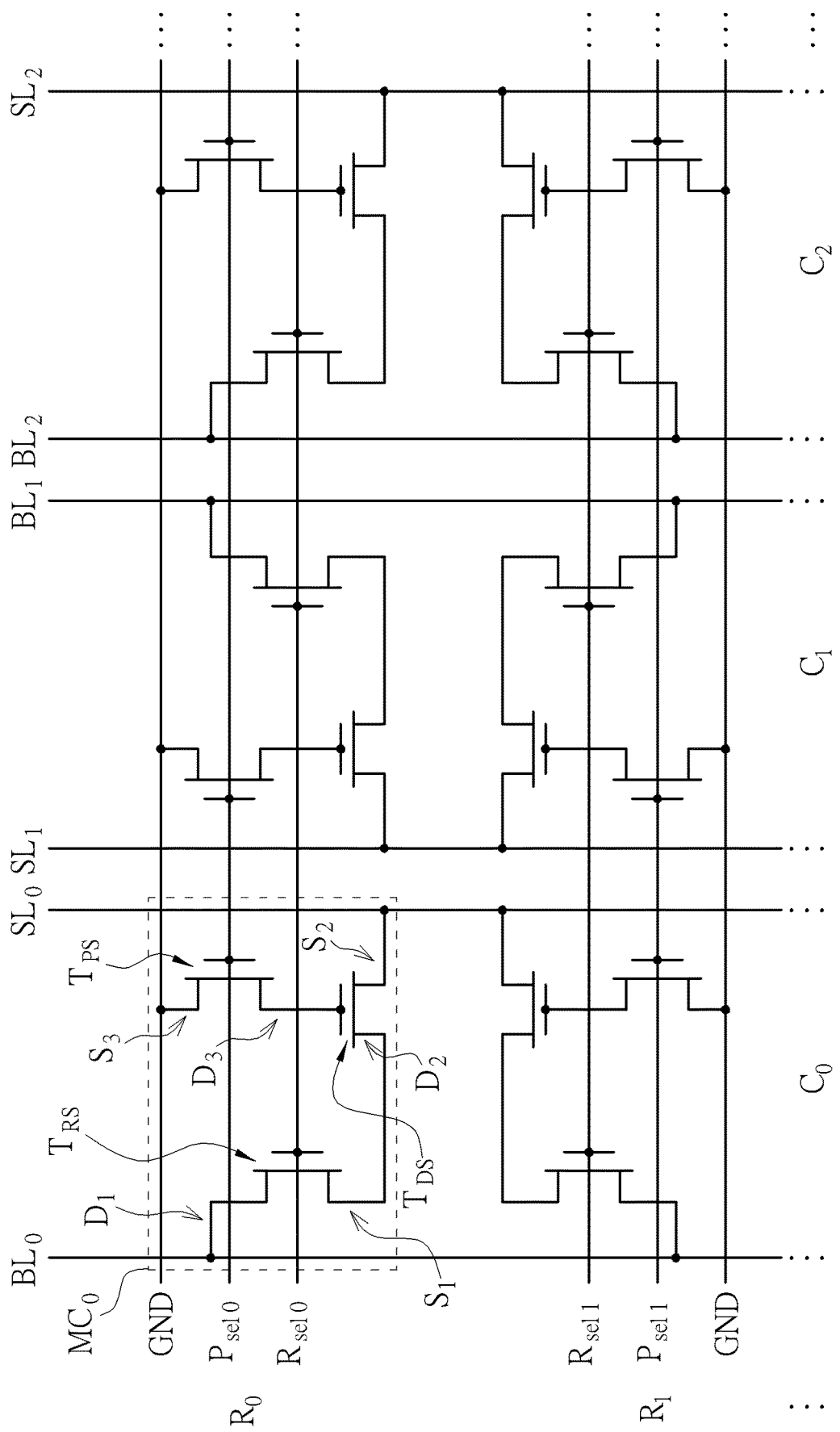
FIG. 3 is a schematic diagram showing an exemplary semiconductor memory array composed of the semiconductor memory cell as depicted in FIG. 1.

FIG. 3 is a diagram showing an exemplary semiconductor memory array composed of the semiconductor memory cell as depicted in FIG. 1. It is understood that although only a 2×3 cell array are shown in FIG. 3, the semiconductor memory array may be an arbitrary N by M array comprising memory cells arranged in N rows and M columns, where N and M are arbitrary numbers. For example, the memory cell $MC_0$ at the crosspoint of the row $R_0$ and the column $C_0$ comprises the read select transistor $T_{RS}$, the data storage transistor $T_{DS}$, and the program select transistor $T_{PS}$ as described in FIG. 1. The first drain region $D_1$ of the read select transistor $T_{RS}$ is electrically connected to a bit line $BL_0$, the second source region $S_2$ of the data storage transistor $T_{DS}$ is electrically connected to a source line $SL_0$, the first gate $G_1$ of the read select transistor $T_{RS}$ is electrically connected to a read select line $R_{Sel0}$, and the third gate $G_3$ of the program select transistor $T_{PS}$ is electrically connected to a program select line $P_{Sel0}$.

Figure 4:
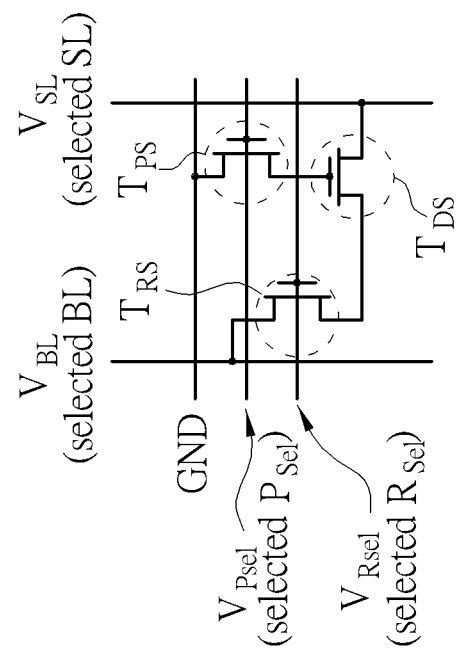
FIG. 4 shows the selected memory cell for the program "1" operation in the semiconductor memory array.
Figure 5:
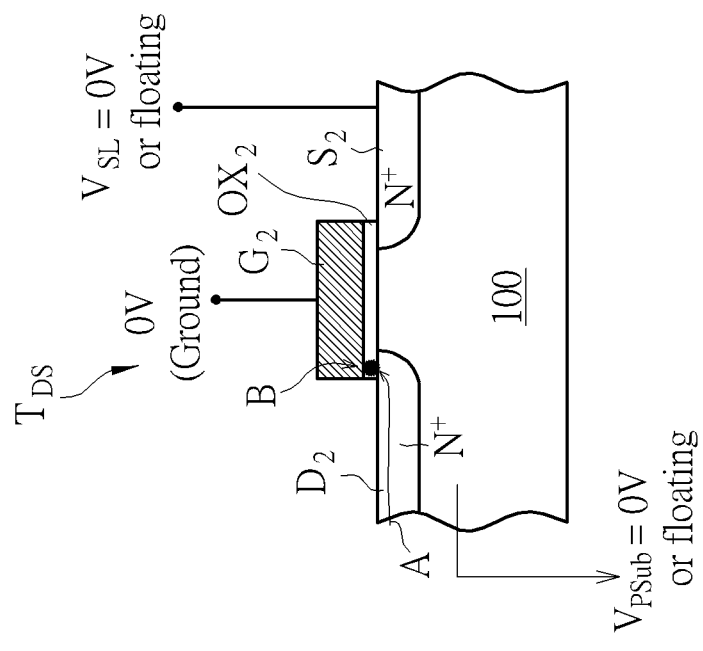
FIG. 5 is a cross section of the selected data storage transistor during the program "1" operation.

Please refer to Table 1 below, FIG. 4, FIG. 5, and briefly to FIG. 1 and FIG. 2. FIG. 4 shows the selected memory cell (or bit unit) of the semiconductor memory array. FIG. 5 is a cross section of the selected data storage transistor $T_{DS}$ during the program "1" operation. Table 1 shows exemplary bias conditions for programming the selected data storage transistor $T_{DS}$ during the program "1" operation.

Generally, a process for programming digital "1" to the selected semiconductor memory cell in FIG. 4 may include the following steps:

(i) grounding the semiconductor substrate 100 and the third source region $S_3$ of the program select transistor $T_{PS}$;

(ii) electrically floating or grounding the second source region $S_2$ of the data storage transistor $T_{DS}$;

(iii) turning on the program select transistor $T_{PS}$ by applying a program select voltage $V_{PSel}$ to the third gate $G_3$, thereby coupling the second gate $G_2$ to ground;

(iv) applying a read select voltage $V_{Rsel}$ to the first gate $G_1$ of the read select transistor $T_{RS}$, wherein the read select voltage $V_{Rsel}$ is higher than the breakdown voltage of the second gate dielectric layer $OX_2$ ($OX_2$ breakdown voltage); and (v) ramping up a bit line voltage $V_{BL}$ applied to the first drain region $D_1$ of the read select transistor $T_{RS}$ through a current limiter until a portion of the second gate dielectric layer $OX_2$ that is directly above the second drain region $D_2$ of the data storage transistor $T_{DS}$ breaks down.

TABLE 1

| Program "1" Condition | |
| --- | --- |
| Terminal | Bias Voltage |
| Selected $P_{Sel}$, $V_{Psel}$ | 1-3 V |
| Unselected $P_{Sel}$ | 0 V |
| Selected $R_{Sel}$, $V_{Rsel}$ | 3-10 V |
| Selected BL, $V_{BL}$ | 3-10 V or Ramp up from 0 V till breakdown |
| Unselected BL | 0 V or Floating |
| $V_{SL}$ | 0 V or Floating |
| $V_{PW}$ | 0 V or Floating |
| $V_{PSub}/V_{DNW}$ | 0 V or Floating |

According to one embodiment of the invention, to program the selected bit unit to "1" state, the following bias conditions may be implemented:

(i) a program select voltage $V_{Psel}$ of about 1-3V is applied to the selected program select line $P_{sel}$ (selected $P_{sel}$) to turn on the program select transistor $T_{PS}$;

(ii) a high enough read select voltage $V_{Rsel}$ ranging between, for example, 3-10V may be applied to the selected read select line $R_{sel}$ (selected $R_{sel}$);

(iii) all the unselected program select lines $P_{sel}$ (unselected $P_{sel}$) and unselected read select lines $R_{sel}$ (unselected $R_{sel}$) are connected to ground GND (or 0V);

(iv) the semiconductor substrate 100 (e.g., P Substrate) is usually connected to ground ($V_{pSub}$=0V), and for the triple well structures as set forth in FIG. 2, the deep N well 110 is connected to ground ($V_{DNW}$=0V) while the P well 120 may be floating or connected to ground ($V_{PW}$=0V or floating);

(v) all the source lines SL and unselected bit lines BL are floating or connected to ground (0V); and (vi) the selected bit line voltage $V_{BL}$ is ramped up, preferred to be through a current limiter to prevent overloading the bit line voltage supply circuit, until a sudden increase in current A and a sudden drop in voltage across the second gate dielectric layer $OX_2$, indicating dielectric breakdown B directly above the second drain region $D_2$ of the selected data storage transistor $T_{DS}$.

Alternatively, the dielectric breakdown B may be caused by simply applying a pre-set bit line voltage $V_{BL}$ that is higher than gate dielectric breakdown voltage (i.e., $OX_2$ breakdown voltage), to the selected bit line, which is also preferred to be done through a current limiter to prevent overloading the bit line voltage supply circuit.

It is one technical feature of the invention that to write digital "1", only the portion of the second gate dielectric layer $OX_2$ that is adjacent to the second drain region $D_2$ (i.e. drain side dielectric) is ruptured, while other portions of the second gate dielectric layer $OX_2$ that are adjacent to the second source region $S_2$ (i.e. source side dielectric) and over the channel region (i.e. channel dielectric) are remained intact.

Preferably, the data storage transistor $T_{DS}$ may have source junction breakdown voltage and drain junction breakdown voltage, which are higher than the gate dielectric breakdown voltage of the data storage transistor. However, this is not necessary for the embodiments with triple well structures. Further, the gate dielectric breakdown voltage and the junction breakdown voltage of the read select transistor $T_{RS}$ are both higher than the gate dielectric breakdown voltage of the data storage transistor $T_{DS}$. This can be achieved by using thicker gate dielectric or cascoding two transistors for the read select transistor $T_{RS}$.

Figure 7:
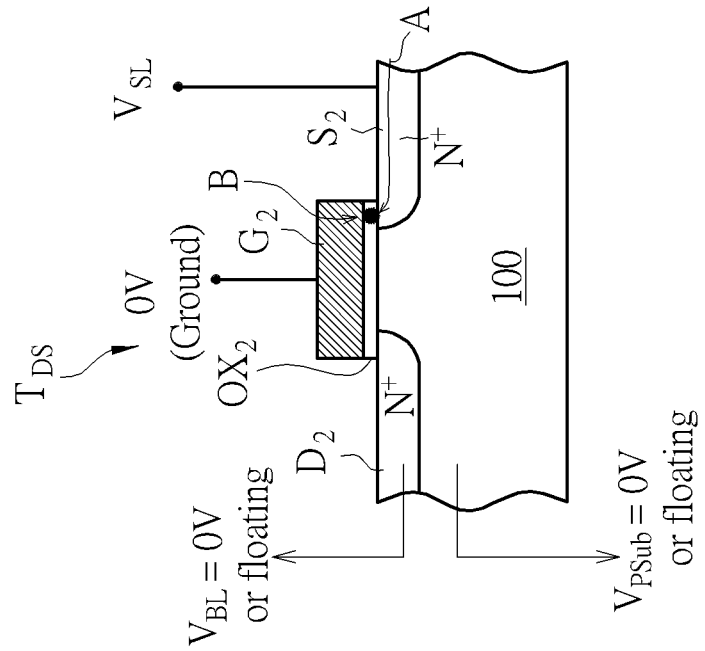
FIG. 7 is a cross section of the selected data storage transistor during the program "0" operation.
Figure 6:
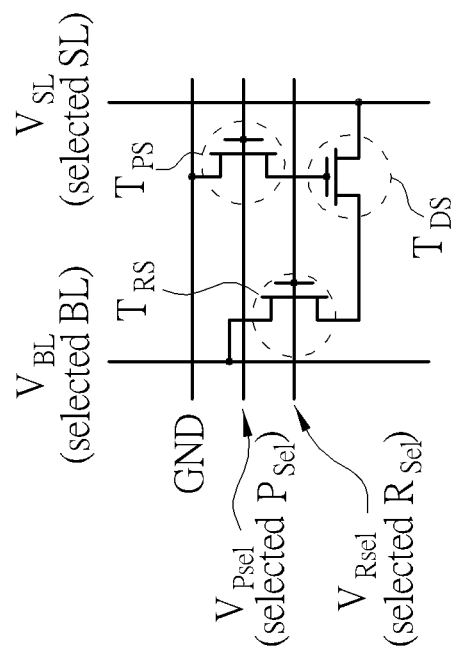
FIG. 6 shows the selected memory cell for the program "0" operation in the semiconductor memory array.

Please refer to Table 2 below, FIG. 6, FIG. 7, and briefly to FIG. 1 and FIG. 2. FIG. 6 shows the selected memory cell (or bit unit) in the semiconductor memory array. FIG. 7 is a cross section of the selected data storage transistor $T_{DS}$ during the program "0" operation. Table 2 shows exemplary bias conditions for programming the selected data storage transistor $T_{DS}$ during the program "0" operation.

Generally, a process for programming digital "0" to the selected semiconductor memory cell in FIG. 7 may include the following steps:

(i) grounding the semiconductor substrate 100;

(ii) turning on the program select transistor $T_{PS}$ by applying a program select voltage $V_{Psel}$ to the third gate $G_3$, thereby coupling the second gate $G_2$ to ground;

(iii) applying a read select voltage $V_{Rsel}$=0V to the first gate $G_1$ to turn off the read select transistor $T_{RS}$; and (iv) ramping up a source line voltage $V_{SL}$ applied to the second source region $S_2$ of the data storage transistor $T_{DS}$ through a current limiter until a portion of the second gate dielectric layer $OX_2$ that is directly above the second source region $S_2$ of the data storage transistor $T_{DS}$ breaks down.

TABLE 2

Program "0" Condition

| Terminal | Bias Voltage |
| --- | --- |
| Selected $P_{Sel}$, $V_{Psel}$ | 1-3 V |
| All $R_{Sel}$ | 0 V or don't care |
| Unselected $P_{Sel}$ | 0 V |
| Selected SL, $V_{SL}$ | 3-10 V or Ramp up from 0 V till breakdown |
| Unselected SL | 0 V or Floating |
| All BL, $V_{BL}$ | 0 V or Floating |
| P-Well, $V_{PW}$ | 0 V or Floating |
| Others, $V_{PSub}/V_{DNW}$ | 0 V or Floating |

According to one embodiment of the invention, to program the selected bit unit to "0" state, the following bias conditions may be implemented:

(i) a program select voltage $V_{Psel}$ of about 1-3V is applied to the selected program select line $P_{sel}$ (selected $P_{sel}$) to turn on the program select transistor $T_{PS}$;

(ii) all the unselected program select lines $P_{sel}$ (unselected $P_{sel}$) are connected to ground (or 0V);

(iii) all the read select lines $R_{sel}$ are connected to 0V or don't care;

(iv) the semiconductor substrate 100 (e.g., P Substrate) is usually connected to ground (0V), and for the triple well structures as set forth in FIG. 2, the deep N well 110 is connected to ground ($V_{DNW}$=0V) while the P well 120 may be floating or connected to ground ($V_{PW}$=0V or floating);

(v) all the bit lines BL and unselected source lines SL are floating or connected to ground; and (vi) the selected source line voltage $V_{SL}$ is ramped up, preferred to be through a current limiter to prevent overloading the source line voltage supply circuit, until a sudden increase in current A and a sudden drop in voltage across the second gate dielectric layer $OX_2$, indicating dielectric breakdown B directly on the second source region $S_2$ of the selected data storage transistor $T_{DS}$.

Alternatively, the dielectric breakdown B may be caused by simply applying a pre-set source line voltage $V_{SL}$ that is higher than gate dielectric breakdown voltage (i.e., $OX_2$ breakdown voltage), to the selected source line, which is also preferred to be through a current limiter to prevent overloading the source line voltage supply circuit.

It is another technical feature of the invention that to write digital "0", only the portion of the second gate dielectric layer $OX_2$ that is adjacent to the second source region $S_2$ (i.e. source side dielectric) is ruptured, while other portions of the second gate dielectric layer $OX_2$ that are adjacent to the second drain region $D_2$ (i.e. drain side dielectric) and over the channel region (i.e. channel dielectric) are remained intact.

Please refer to Table 3 below, FIG. 8 and FIG. 9. FIG. 8 is a cross section of the data storage transistor $T_{DS}$ with "1" state during read operation. FIG. 9 is a cross section of the data storage transistor $T_{DS}$ with "0" state during read operation. Table 3 shows exemplary bias conditions for reading data storage transistor $T_{DS}$.

To read a memory cell, the following exemplary bias conditions may be implemented:

(i) all the program select lines $P_{sel}$ are connected to ground (0V) to turn off all program select transistors $T_{PS}$ so that all the second gates $G_2$ of the data storage transistors $T_{DS}$ are isolated from the outside bias. Therefore, voltage of the second gate $G_2$ of the data storage transistors $T_{DS}$ is the same as that of second drain region $D_2$ if the dielectric breakdown B, caused during the programming procedure, is on the drain side, and the same as that of second source region $S_2$ if the dielectric breakdown B is on the source side;

(ii) a read select voltage $V_{Rsel}$ of about 1-3V is applied to the selected read select lines $R_{sel}$ so that drain of the selected data storage transistors $T_{PS}$ is connected to the selected bit line BL to which a bit line voltage $V_{BL}$ of 0.5-2V is applied; and (iii) all the other terminals are connected to ground (0V).

TABLE 3

Read Bias Condition

| Terminal | Bias Voltage |
| --- | --- |
| All $P_{Sel}$ | 0 V |
| Selected $R_{Sel}$ | 1-3 V |
| Unselected $R_{Sel}$, | 0 V |
| Selected BL | 0.5-2 V |
| Unselected BL | 0 V or Floating |
| All SL | 0 V |
| P-Well | 0 V |
| Others | 0 V |

Under the aforesaid read bias conditions, the data storage transistors $T_{DS}$ has a high channel current CL if the dielectric breakdown B is on the drain side because the gate voltage is high, same as the voltage applied to the second drain region $D_2$, and the data storage transistors $T_{DS}$ ("1" state) is turned on. On the other hand, for the data storage transistors $T_{DS}$ in "0" state, there is no channel current (or only an insignificant amount of off-current) because the voltage coupled to the second gate $G_2$ is low, same as the voltage applied to the second source region $S_2$, and the data storage transistors $T_{DS}$ ("0" state) is turned off. Therefore, the read current path is not through the ruptured dielectric, but is through the channel region of the data storage transistor $T_{DS}$.

According to some embodiments, all the isolated second gates $G_2$ of the data storage transistors $T_{DS}$ may be pre-charged by turning on all read select transistors $T_R$ simultaneously and applying 0.5-2V to all bit lines and 0V to all source line for a short period of time (e.g., 3 ms) prior to reading the entire OTP memory array. This can prevent those soft breakdown bits from errors due to slow charging.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising at least a one-time programmable (OTP) unit cell wherein a programming current path for programming the OTP unit cell is different from a reading current path for reading the OTP unit cell, wherein the OTP unit cell comprises:
    a semiconductor substrate;
    a read select transistor on the semiconductor substrate, the read select transistor comprising a first gate, a first gate dielectric layer between the first gate and the semiconductor substrate, a first drain region in the semiconductor substrate on one side of the first gate, and a first source region in the semiconductor substrate on the other side of the first gate;
    a data storage transistor in series connection with the read select transistor, the data storage transistor comprising a second gate, a second gate dielectric layer between the second gate and the semiconductor substrate, a second drain region in the semiconductor substrate on one side of the second gate, and a second source region in the semiconductor substrate on the other side of the second gate, wherein the second source region is connected to a source line voltage; and
    a program select transistor comprising a third gate, a third gate dielectric layer between the third gate and the semiconductor substrate, a third drain region in the semiconductor substrate on one side of the third gate, and a third source region in the semiconductor substrate on the other side of the third gate, wherein the third drain region is electrically connected to the second gate of the data storage transistor, wherein the third gate is not connected to the third source region.

2. The OTP unit cell according to claim 1, wherein the semiconductor substrate comprises a first active area isolated by a first trench isolation structure and a second active area isolated by a second trench isolation structure.

3. The OTP unit cell according to claim 2, wherein the read select transistor and the data storage transistor are constructed on the first active area, and wherein the program select transistor is constructed on the second active area.

4. The OTP unit cell according to claim 1, wherein the semiconductor substrate has a first conductivity type, and wherein the first drain region, the first source region, the second drain region, the second source region, the third drain region, and the third source region have a second conductivity type that is opposite to the first conductivity type.

5. The OTP unit cell according to claim 4, wherein the first conductivity type is P type and the second conductivity type is N type.

6. The OTP unit cell according to claim 1, wherein the semiconductor substrate comprises a silicon substrate or a silicon-on-insulator (SOI) substrate.

7. The OTP unit cell according to claim 1, wherein the read select transistor, the data storage transistor, and the program select transistor are NMOS transistors.

8. The OTP unit cell according to claim 1, wherein the first gate, the second gate, and the third gate comprise a single polysilicon layer or a metal gate.

9. The OTP unit cell according to claim 1, wherein a source junction breakdown voltage and a drain junction breakdown voltage of the data storage transistor are higher than a gate dielectric breakdown voltage of the data storage transistor.

10. The OTP unit cell according to claim 9, wherein a gate dielectric breakdown voltage and a junction breakdown voltage of the read select transistor are both higher than the gate dielectric breakdown voltage of the data storage transistor.

11. The OTP unit cell according to claim 1, wherein the second gate dielectric layer has a thickness that is smaller than that of the first gate dielectric layer.

12. The OTP unit cell according to claim 1, wherein the semiconductor substrate is a P type substrate, and wherein the read select transistor, the data storage transistor, and the program select transistor are constructed on a triple well structure comprising a deep N well in the P type substrate and a P well isolated from the P type substrate by the deep N well.

13. A process for programming digital "1" to the OTP unit cell according to claim 1, comprising:
    grounding the semiconductor substrate and the third source region of the program select transistor;
    electrically floating or grounding the second source region of the data storage transistor;
    turning on the program select transistor by applying a program select voltage to the third gate, thereby coupling the second gate to ground;
    applying a read select voltage to the first gate of the read select transistor, wherein the read select voltage is higher than a breakdown voltage of the second gate dielectric layer; and
    ramping up a bit line voltage applied to the first drain region of the read transistor through a current limiter to break down a portion of the second gate dielectric layer that is directly above the second drain region of the data storage transistor.

14. The OTP unit cell according to claim 13, wherein the program select voltage ranges between 1-3V and the read select voltage ranges between 3-10V.

15. A process for programming digital "1" to the OTP unit cell according to claim 1, comprising:
    grounding the semiconductor substrate and the third source region of the program select transistor;
    electrically floating or grounding the second source region of the data storage transistor;
    turning on the program select transistor by applying a program select voltage to the third gate, thereby coupling the second gate to ground;

applying a read select voltage to the first gate of the read select transistor, wherein the read select voltage is higher than a breakdown voltage of the second gate dielectric layer; and applying a pre-set bit line voltage higher than the breakdown voltage of the second gate dielectric layer, to the first drain region through a current limiter.

16. A process for programming digital "0" to the OTP unit cell according to claim 1, comprising:

grounding the semiconductor substrate;

turning on the program select transistor by applying a program select voltage to the third gate, thereby coupling the second gate to ground;

applying 0V to the first gate of the read select transistor to turn off the read select transistor; and ramping up a source line voltage applied to the second source region of the data storage transistor through a current limiter to break down a portion of the second gate dielectric layer that is directly above the second source region of the data storage transistor.

17. The OTP unit cell according to claim 16, wherein the program select voltage ranges between 1-3V and the source line voltage ranges between 3-10V.

18. A process for programming digital "0" to the OTP unit cell according to claim 1, comprising:

grounding the semiconductor substrate;

turning on the program select transistor by applying a program select voltage to the third gate, thereby coupling the second gate to ground;

applying 0V to the first gate of the read select transistor to turn off the read select transistor; and applying a pre-set source line voltage higher than gate dielectric breakdown voltage of the data storage transistor, to the second source region through a current limiter.

19. A process for reading the OTP unit cell according to claim 1, comprising:

turning off the program select transistors so that the second gate of the data storage transistor is isolated from outside bias;

applying a read select voltage to the first gate of the read select transistor to turn on the read select transistor;

applying a bit line voltage to the first drain region of the read select transistor; and grounding all other terminals of the OTP unit cell.

20. The OTP unit cell according to claim 19, wherein the read select voltage ranges between 1-3V and the bit line voltage ranges between 0.5-2V.

21. The semiconductor device according to claim 1, wherein the OTP unit cell comprises a programmable MOS transistor that is electrically programmed to "1" state or "0" state.

22. The semiconductor device according to claim 21, wherein the programmable MOS transistor is programmed to the "1" state by rupturing a gate dielectric layer between a gate and a drain of the MOS transistor.

23. The semiconductor device according to claim 21, wherein the programmable MOS transistor is programmed to "0" state by rupturing the gate dielectric layer between the gate and a source of the MOS transistor.

24. The semiconductor device according to claim 23, wherein the gate of the programmable MOS transistor is switched between ground and floating by a switching MOS transistor.

* * * * *